United States Patent
McGrath et al.

(10) Patent No.: US 7,478,354 B2
(45) Date of Patent: *Jan. 13, 2009

(54) USE OF CONFIGURABLE MIXED-SIGNAL BUILDING BLOCK FUNCTIONS TO ACCOMPLISH CUSTOM FUNCTIONS

(75) Inventors: Donald T. McGrath, Fort Collins, CO (US); Scott C. Savage, Fort Collins, CO (US); Robert D. Waldron, Fort Collins, CO (US); Kenneth G. Richardson, Erie, CO (US)

(73) Assignee: LSI Corporation, Milpitas, CA (US)

( * ) Notice: Subject to any disclaimer, the term of this patent is extended or adjusted under 35 U.S.C. 154(b) by 86 days.

This patent is subject to a terminal disclaimer.

(21) Appl. No.: 11/133,815

(22) Filed: May 20, 2005

(65) Prior Publication Data

US 2006/0263933 A1 Nov. 23, 2006

(51) Int. Cl.
*G06F 17/50* (2006.01)
(52) U.S. Cl. .................. 716/12; 716/13; 716/14
(58) Field of Classification Search ............. 716/12–15
See application file for complete search history.

(56) References Cited

U.S. PATENT DOCUMENTS

| 5,126,599 | A * | 6/1992 | Gobbi et al. | 326/47 |
| 7,292,063 | B2 * | 11/2007 | Savage et al. | 326/38 |
| 7,305,646 | B2 * | 12/2007 | McGrath et al. | 716/12 |
| 7,360,178 | B2 * | 4/2008 | Savage et al. | 716/1 |
| 7,373,629 | B2 * | 5/2008 | McGrath et al. | 716/17 |
| 2004/0049604 | A1 * | 3/2004 | Nation et al. | 710/1 |

* cited by examiner

*Primary Examiner*—Jack Chiang
*Assistant Examiner*—Nghia M Doan
(74) *Attorney, Agent, or Firm*—Christopher P. Maiorana, PC (57) ABSTRACT

A method for producing a chip is disclosed. A first step of the method may involve fabricating the chip only up to and including a first metal layer during a first manufacturing phase such that an input/output (I/O) region of the chip has a plurality of slots, where each of the slots has a plurality of first transistors. A second step of the method may involve designing a plurality of upper metal layers above the first metal layer in response to a custom design created after the first fabricating has started, the upper metal layers interconnecting a plurality of the first transistors to form a plurality of mixed-signal building block functions. A third step of the method may involve fabricating the chip to add the upper metal layers during a second manufacturing phase.

20 Claims, 11 Drawing Sheets

USE OF CONFIGURABLE MIXED-SIGNAL BUILDING BLOCK FUNCTIONS TO ACCOMPLISH CUSTOM FUNCTIONS

FIELD OF THE INVENTION

The present invention relates to platform application specific integrated circuit (platform ASIC) design generally and, more particularly, to a method and/or architecture for using configurable mixed-signal building block functions to accomplish custom functions.

BACKGROUND OF THE INVENTION

An integrated circuit (IC) design can include support for mixed-signal functions. The term mixed-signal refers to functions involving both digital and analog signals. In platform application specific integrated circuits (platform ASICs), custom diffused mixed-signal areas are placed on metal mask programmable platforms to support a mixed-signal function. With conventional solutions, accommodating custom mixed-signal functions in a platform ASIC is not feasible without adding significant silicon overhead. Because of the added overhead, a manufacturer may avoid bidding designs that involve custom functions, thus losing revenue opportunities.

It would be desirable to have an architecture and/or method for using configurable mixed-signal building block functions to accomplish custom functions.

SUMMARY OF THE INVENTION

The present invention concerns a method for producing a chip. A first step of the method may involve fabricating the chip only up to and including a first metal layer during a first manufacturing phase such that an input/output (I/O) region of the chip has a plurality of slots, where each of the slots has a plurality of first transistors. A second step of the method may involve designing a plurality of upper metal layers above the first metal layer in response to a custom design created after the first fabricating has started, the upper metal layers interconnecting a plurality of the first transistors to form a plurality of mixed-signal building block functions. A third step of the method may involve fabricating the chip to add the upper metal layers during a second manufacturing phase.

The objects, features and advantages of the present invention include providing an architecture and/or method for using configurable mixed-signal building block functions to accomplish custom functions that may (i) be formed using a metal mask set, (ii) be formed using a number of pre-diffused regions of a platform ASIC, (iii) be instantiated in multiple locations on a chip, (iv) be instantiated multiple times on a chip, (v) comprise two or more sub-functions implemented in two or more I/O slots, (vi) provide custom mixed-signal functions in areas conventionally used for digital circuitry, (vii) allow relocatable placement of custom mixed-signal functions, (viii) implement custom mixed-signal building blocks using pre-diffused base layers of a platform ASIC, (ix) provide amplifiers, comparators, switches, resistor arrays, capacitor arrays, etc. and/or (ix) be placed anywhere around a chip.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
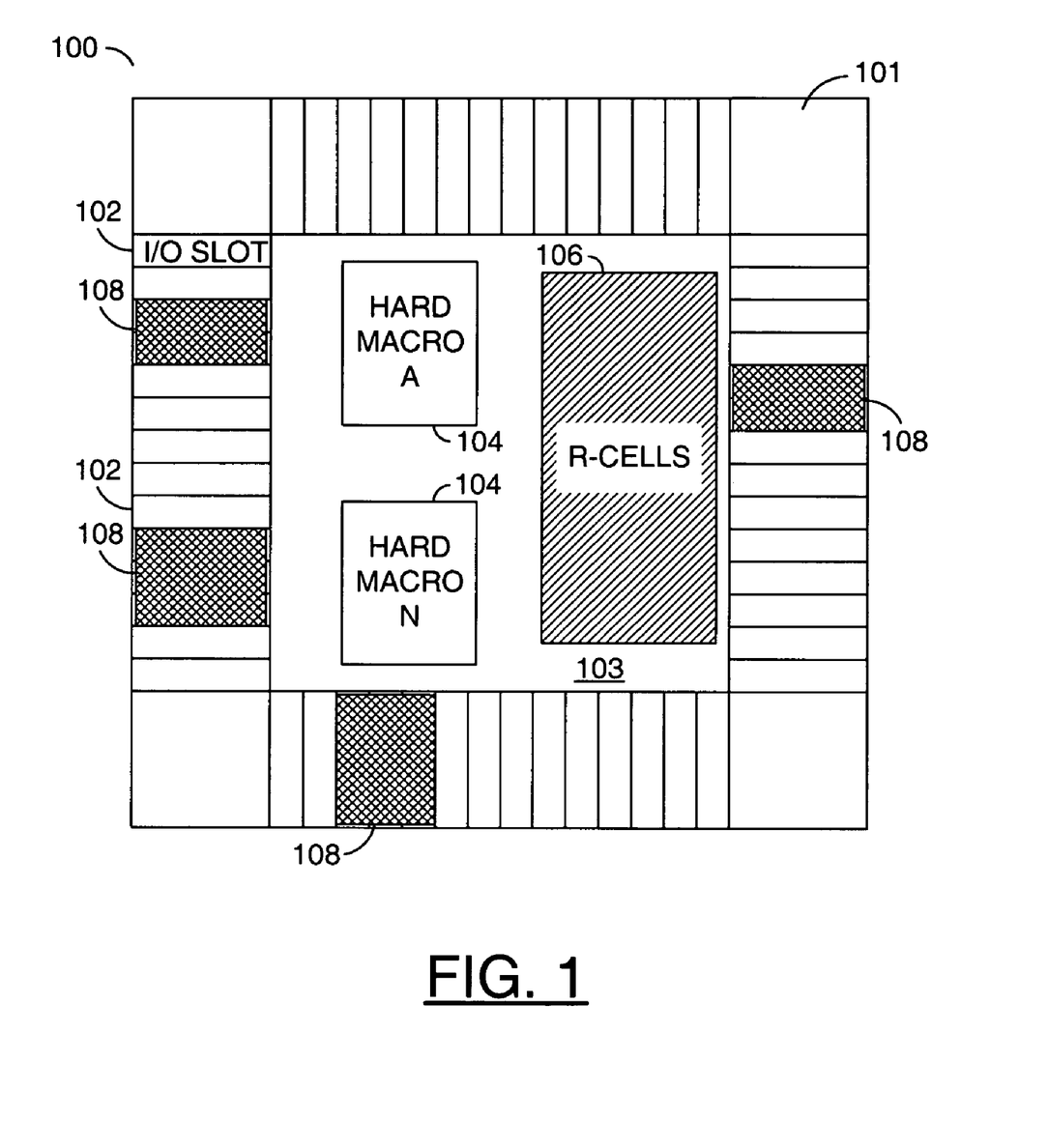
FIG. 1 is a block diagram illustrating a platform application specific integrated circuit (ASIC) in accordance with one or more preferred embodiments of the present invention.

Referring to FIG. 1, a block diagram of a programmable platform device (or die, or chip, or slice) 100 is shown in accordance with one or more preferred embodiments of the present invention. The slice 100 may be implemented, in one example, as a partially manufactured semiconductor device (e.g., a platform or structured application specific integrated circuit (platform ASIC)) in which all of the silicon layers (or base layers) have been fabricated (e.g., during a first processing, manufacturing or pre-inventory phase), but where customization of the slice 100 may be performed later (e.g., during a second processing, manufacturing or completed phase) via one or more upper metal layers. In general, the first manufacturing phase may configure the slice 100 as a configurable platform capable of being customized for any of a plurality of applications. The second manufacturing phase may customize the slice 100 for a specific application defined by an end-user.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice 100 may be selected for customization at a later time because the particular IP blocks implemented are suitable for a customized application. By deferring customization of the slice 100, a manufacturer may have flexibility to keep an inventory of mostly complete slices 100 that may be customized for a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.).

Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

A physical layout of the slice 100 generally comprises a first region 101 that may be defined around a periphery (or outer edge) of the slice 100. The first region may comprise a plurality of input/output (I/O) circuits (or slots) 102. The physical layout of the slice 100 may further comprise a second region 103 that may be located inside the first region 101. The second region 103 may contain standard library and/or custom circuitry that makes the slice 100 unique. The second region 103 may be referred to as a core region.

The slice 100 may comprise a number of pre-diffused regions. In one example, the slice 100 may comprise the plurality of regions 102, a number of regions 104, and one or more regions 106. The regions 102 may be implemented as configurable I/O slots (or ConfigIOs). For example, each of the regions 102 may be configured to couple the core region 103 of the slice 100 to an I/O pin. The regions 104 may be implemented as one or more hard IP blocks (or hardmacros). The regions 106 may be implemented as one or more customizable regions. In one example, the customizable regions 106 may comprise a programmable transistor fabric (e.g., a plurality of R-cells). In another example, the diffused regions 106 may be implemented as a gate array region. The plurality of regions 102 may be distributed around the periphery (or edge) of the slice 100. The regions 104 and 106 may be distributed within the core region 103 of the slice 100.

In one example, the regions 104 may be implemented similarly to an ASIC design. In general, the regions 104 may be configured to provide a number of functions on (or in) the slice 100. For example, the regions 104 may comprise phase locked loop (PLL) blocks (or modules), instances of processor blocks (or modules), input/output physical level (PHY) macro blocks (or modules), and/or any other type of IP block (or module) appropriate to meeting the design criteria of a particular implementation. Soft IP blocks (or modules) and firm IP blocks (or modules) may be implemented in the customizable region(s) 106.

The region 106 may be customized (e.g., by application of one or more metal layers), in one example, as logic and/or memory. In one example, the region 106 may be implemented as a sea of gates (or gate array). In another example, the region 106 may be implemented as a configurable transistor fabric comprising a number of R-cells. The term R-cell generally refers to an area of silicon designed (or diffused) to contain multiple transistors that have not yet been personalized (or configured) with metal layers. Wire (or trace) layers may be added for interconnecting the R-cells to make particular transistors, logic gates, soft and firm IP blocks and/or storage elements. For example, the R-cells in the region 106 may be customized to build non-diffused memories or other circuits for a particular application. A region 106 filled with thousands of R-cells may be referred to as an R-cell transistor fabric.

An R-cell generally comprises multiple diffusions, a gate layer and a metal layer for forming the parts of N-type and/or P-type transistors, and the contact points where upper metal (or wire) layers may be attached in subsequent manufacturing steps (e.g., to power, ground, inputs and outputs). For example, each R-cell may be implemented as a five-transistor cell, which includes two n-channel metal oxide semiconductor field effect transistors (NMOS devices), two p-channel MOS field effect transistors (PMOS devices) and one small PMOS device. In general, the R-cells may be, in one example, building blocks for logic, mixed-signal and/or storage elements. The R-cells may be diffused in a regular pattern throughout the slice 100. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing and patterning metal layers) to provide particular logic and mixed-signal functions. The logic and mixed-signal functions may be further wired together (e.g., a gate array design).

Prior to customization, the regions 102 may comprise generic pre-diffused regions that may provide a rich set of devices (e.g., transistors, resistors, capacitors, etc.). A number of different generic pre-diffused regions may be implemented (e.g., CONFIGIO1, CONFIGIO2, etc.). In one example, a number of types of transistors (e.g., N and P, TO, ATO, HP, etc.) may be implemented in each of the regions 102. Some example types and numbers of devices that may be implemented in the regions 102 may be summarized in the following TABLE 1:

TABLE 1

| CONFIGIO2 | | CONFIGIO1 | |
| --- | --- | --- | --- |
| Device Type | Number | Device Type | Number |
| pm_hp | 401 | pm_hp | 178 |
| pm_ato | 2048 | pm_ato | 470 |
| nm_ato | 129 | nm_to | 66 |
| nm_aton | 84 | nm_esd | 12 |
| nm_esd | 16 | resistors | 21 |
| nm_hp | 372 | | |
| nm_to | 1798 | | |
| resistors | 84 | | |

However, it will be understood by those skilled in the art that other types and/or numbers of devices may be implemented without departing from the spirit and scope of the present invention.

The devices implemented in the regions 102 may be programmed by defining metal mask sets. In one example, metal-insulator-metal capacitors (e.g., approximately one picofarad (pF) per slot) may be formed in the regions 102 where I/O power buses are absent. In one example, more than one of the regions 102 may be combined (e.g., coupled together via routing) to implement more complex functions. For example, metal mask sets may be placed over two or more of the generic pre-diffused regions 102 to form a relocatable custom mixed-signal function 108. The custom mixed-signal function 108 may be described as a relocatable function. The term relocatable is used as a general term to indicate that the function may be located (or configured) in a number of locations around the slice 100. While the final result would be that the function 108 would be located in different locations, different pre-diffused regions 102 would be used to implement the function 108 in the different locations. Also, one or more of the custom functions 108 may be implemented throughout the plurality of regions 102. The custom function 108 may be configured to provide custom mixed-signal functions using metal programmability.

In general, the present invention allows the custom mixed-signal functions 108 to be constructed without any special diffused circuitry, special process options, and/or additional wafer cost. The mixed-signal functions 108 may be located on any I/O slot 102 boundary. Because the relocatable custom mixed-signal functions 108 can be located on any I/O slot 102 boundary, the present invention may provide a flexible pinout. Some examples of custom mixed-signal functions 108 may be summarized in the following TABLE 2:

TABLE 2

| Circuit | # of Slots | Applications | Function |
|---|---|---|---|
| PLL/DLL (500 MHZ range or less | 5-6 | Clock multipliers, clock-data deskew | Clock generation |
| Temperature Sensor (+/−10-15 degree C. accuracy) | 2-3 | Cabinet design, package selection verification, system testing, reliability verification | Provides digital output proportional to die temperature |
| Voltage regulator | 1-2 | Any product that employs dual voltages | Generates 1.2 V, 1.8 V, or 2.5 V supply from 2.5 V or 3.3 V supply. May use external pass device. |
| Power On Reset (POR) | 1-2 | May be employed in any electronic product or system | Signals when I/O or core voltages are at valid levels |
| 8-10 bit, 1 Msps ADC | 3-5 | Tape/disc drive servos, MP3 players, digital cameras, wireless devices, fish finders, featurized phones, circuit breakers, process controllers | Sensor interface (temperature, touchpanel, battery monitor, vibration, humidity, position, other), RSSI, control systems |
| 12-14 bit, 20 Ksps Sigma-delta ADC | 1-3 | Circuit breakers, power meters, instrumentation, voice encoders, motor diagnostics, medical devices, process controllers | Sensor interface (temperature, touchpanel, battery monitor, vibration, humidity, position, other) |
| 8-bit, 10 Msps DAC | 2-3 | Motion control, process control, Tape/disc servos, digital trimming | Actuation and control |
| 32 KHz-50 MHz Crystal Oscillator | 2 | Any application where a system clock is not always available: MP3 players, digital cameras, wireless devices, fish finders, featurized phones, circuit breakers | Generates a clock at a specified frequency set by the crystal |
| Filter (SC, CT) | 1-5 | Tape read-channels, voice encoders, instrumentation, circuit breakers | Conditions as analog signals |

However, other building blocks (or circuits) may be implemented accordingly to accomplish custom analog functions. For example, other building blocks may include, but are not limited to, operational amplifiers, comparators, analog multiplexers, analog switches, voltage/current reference. The region 106 may also be used to implement portions (or sub-functions) of the custom mixed-signal functions 108 (e.g., switched capacitor filters, gm/C filters, data converters, etc.).

In one example, the relocatable mixed-signal functions 108 may be built using one or more metal mask sets. The metal mask sets may be placed over two or more of the generic pre-diffused regions 102. The metal mask sets may be configured to form two or more sub-functions of the relocatable mixed-signal function 108. The relocatable mixed-signal functions in accordance with the present invention generally allow custom mixed-signal type or very sophisticated I/O functions to be defined and placed in the pre-diffused I/O slots 102.

Figure 2:
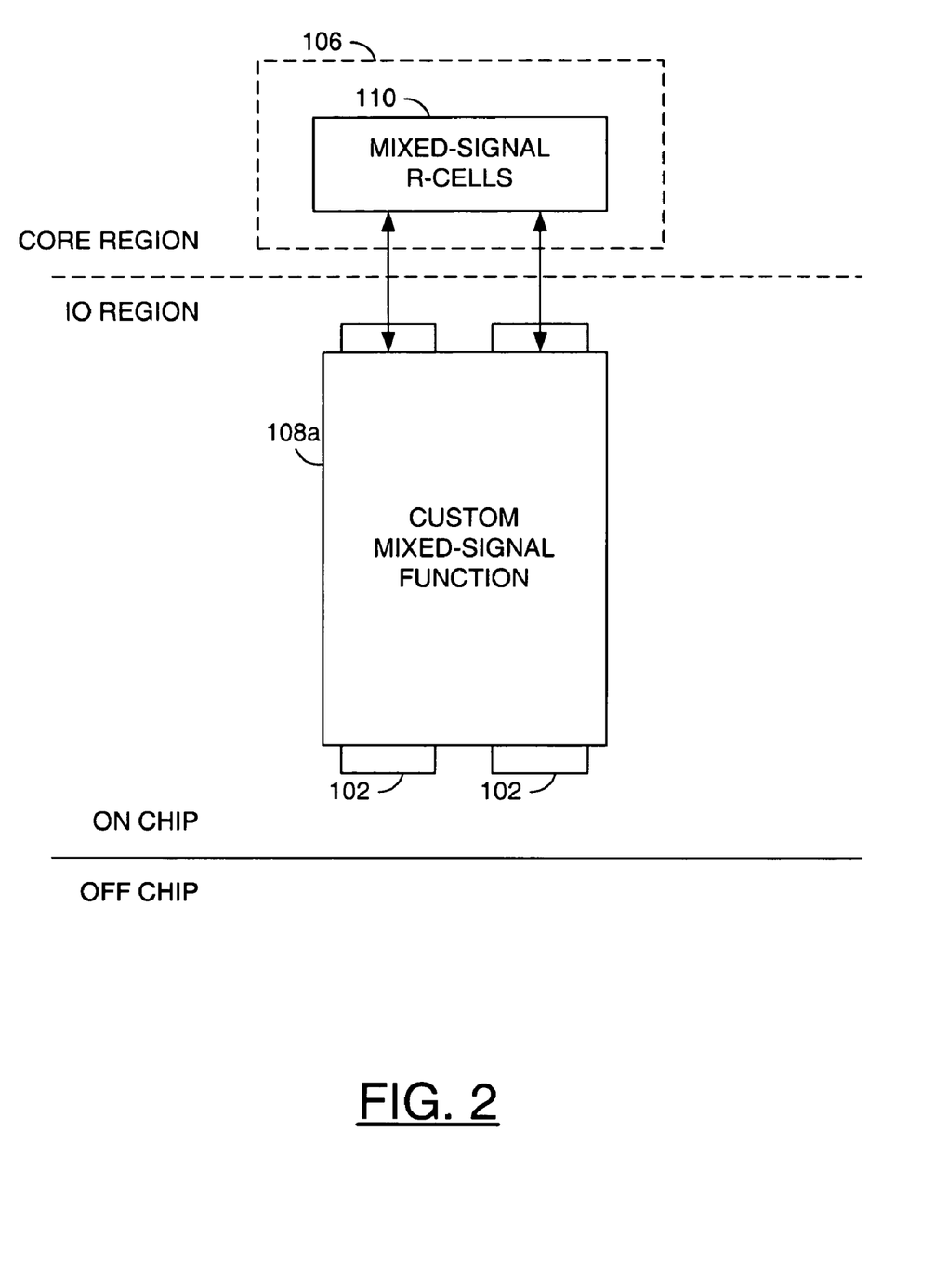
FIG. 2 is a block diagram illustrating a relocatable custom mixed-signal function in accordance with a preferred embodiment of the present invention.

Referring to FIG. 2, a block diagram illustrating an example custom function in accordance with a preferred embodiment of the present invention is shown. In one example, a relocatable custom function 108*a* may be implemented using one or more of the regions 102. In one example, the relocatable custom function 108*a* may be implemented as a mixed-signal function. However, the custom function 108*a* may be configured for analog signals, digital signals or both analog and digital signals. The relocatable custom function 108*a* may further comprise a portion (or sub-function) 110. The sub-function 110 may be implemented in the region 106 (e.g., using R-cells). Routing may be implemented to connect the function 108*a* and sub-function 110.

Figure 3:
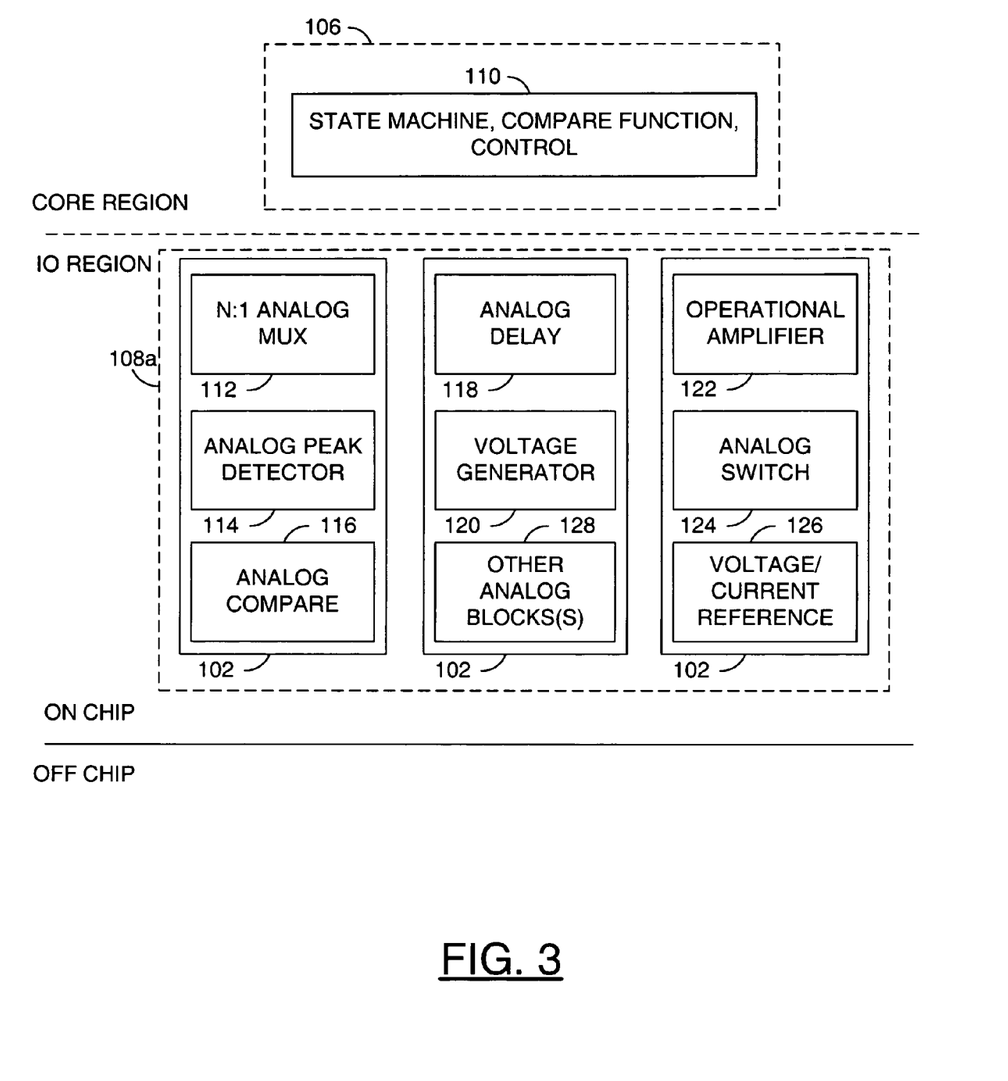
FIG. 3 is a more detailed block diagram illustrating an example implementation of mixed-signal building block functions forming a custom mixed-signal function.

Referring to FIG. 3, a more detailed block diagram is shown illustrating an example custom function 108*a* of FIG. 2. In one example, the custom function 108*a* may be implemented using a number of the R-cells in the region 106 and a number (e.g., three) of the regions 102. For example, a state machine, a compare function and/or a control block may be implemented in the region 106. A number of configurable mixed-signal building block functions may be implemented in the regions 102. For example, an N:1 analog multiplexer 112, an analog peak detector 114, an analog comparator 116, an analog delay block 118, a voltage generator block 120, an operational amplifier 122, an analog switch 124, a voltage/current reference block 126 and/or any other appropriate analog or mixed-signal building blocks 128 may be implemented in the regions 102. Although particular blocks have been illustrated for implementing the custom function 108*a*, it would be understood by a person skilled in the field of the present invention that all of the functions, a subset of the functions, or different functions may be implemented in the regions 102 and/or 106. Also, although the custom function 108*a* has been shown implemented with three regions 102, it would be understood by a person of ordinary skill in the field of the invention that one or more than one of the regions 102 may be used to implement particular custom functions.

Figure 4:
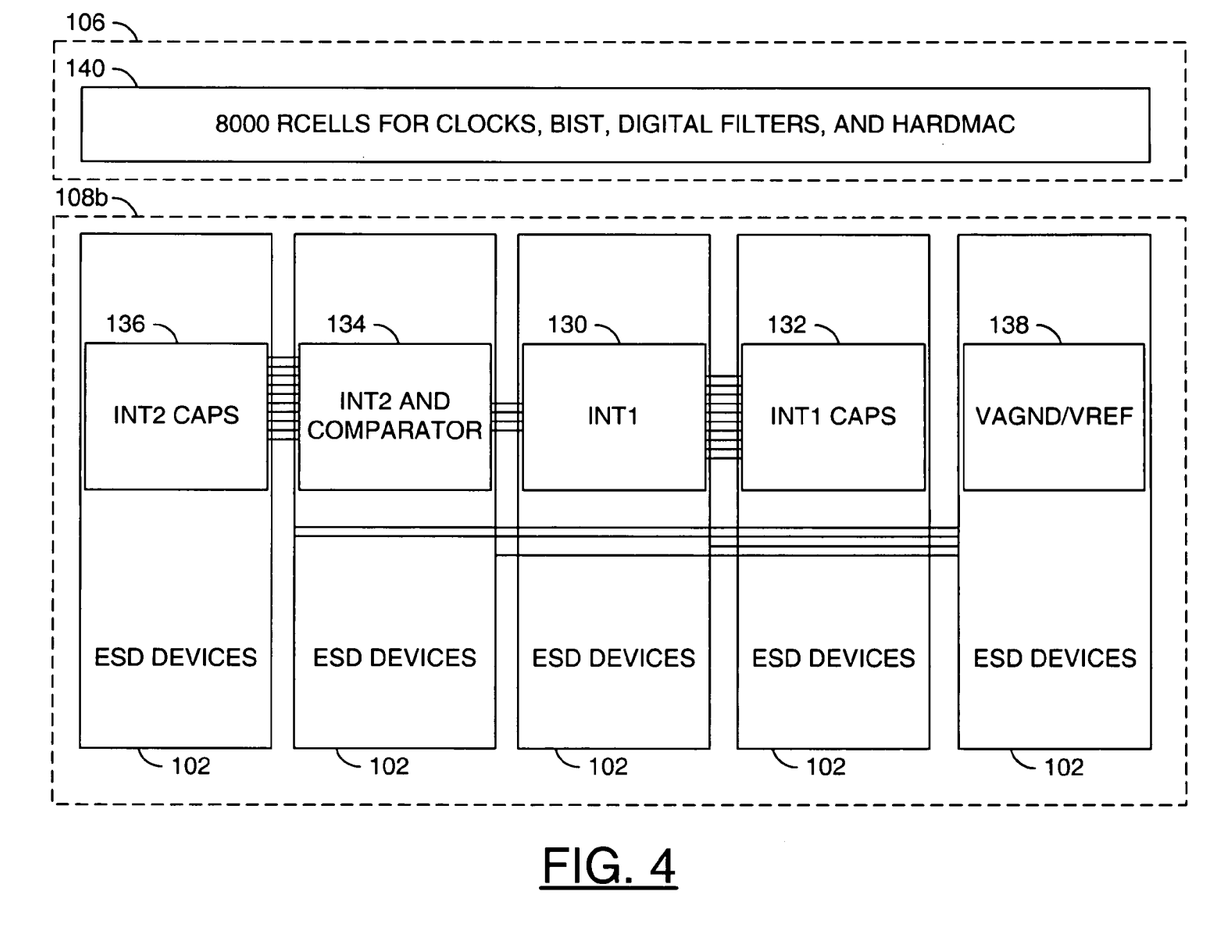
FIG. 4 is a block diagram illustrating a relocatable analog-to-digital convertor (ADC) function in accordance with a preferred embodiment of the present invention.

Referring to FIG. 4, a block diagram is shown illustrating an example relocatable custom mixed-signal function implemented in accordance with another preferred embodiment of the present invention. In one example, an analog-to-digital converter (ADC) may be implemented as a custom relocatable function 108*b*. The ADC function may comprise a sub-function 130, a sub-function 132, a sub-function 134, a sub-function 136, a sub-function 138, and a sub-function 140. The sub-functions 130 to 140 of the custom mixed-signal function may be implemented with one or more metal mask sets configured to customize one or more respective regions 102 to form the multi-slot function 108*b* and/or a portion of the region 106.

In one example, the sub-function 130 may comprise a first integrator (e.g., INT1). The sub-function 132 may comprise one or more capacitors for the first integrator INT1 sub-function 130. The sub-function 134 may comprise a second integrator (e.g., INT2) and a comparator functions. The sub-function 136 may comprise one or more capacitors for the second integrator INT2 sub-function 134. The sub-function 138 may implement an analog supply ground (e.g., VAGND) and reference voltage (e.g., VREF). The sub-function 140 may comprise circuitry for clocks, built-in self test (BIST), digital filters and hardmac interfacing. In one example, the sub-function 140 may be implemented using R-cells (e.g., approximately 8000 R-cells) in a portion of the region 106.

In one example, the capacitors for the first integrator INT1 and the second integrator INT2 may be implemented in metal layers of a device implemented with the slice 100 (e.g., in second and third layers, third and fourth layers, second and fourth layers, etc.). In general, the capacitors are not placed under I/O or core power busses for noise isolation. In general, capacitors with a capacitance of less than four picofarad (pF) may be implemented in each of the integrators. The integrator capacitors and the analog ground and voltage reference generally act as pin isolation. In one example, bias voltages and currents may be routed in the second metal layer under I/O power busses with shielding provided by a third metal layer. Electrostatic discharge (ESD) devices may also be implemented in each of the regions 102. In general, the ESD devices may be placed under I/O power busses.

Figure 5:
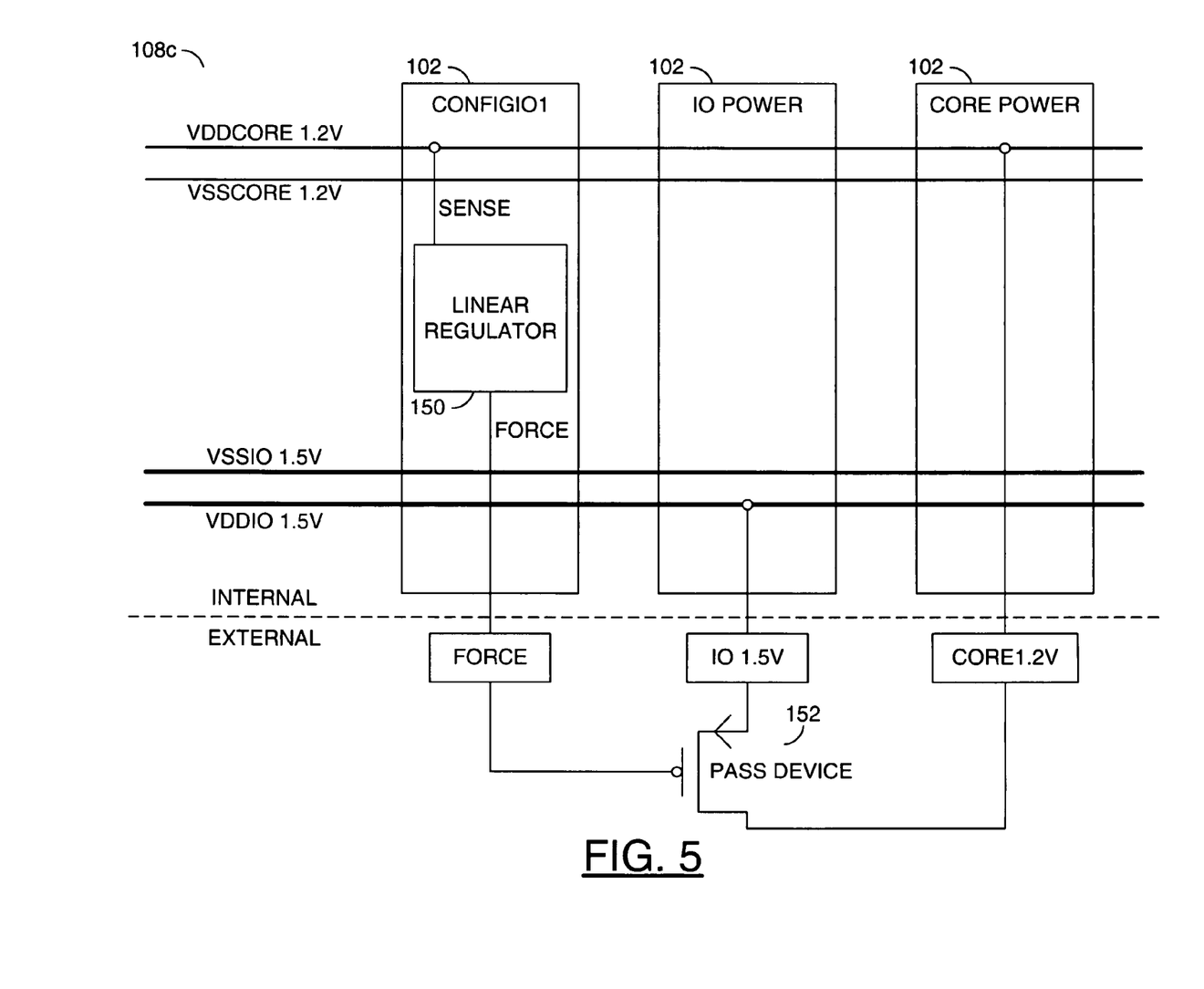
FIG. 5 is a block diagram illustrating a relocatable linear regulator function in accordance with a preferred embodiment of the present invention.

Referring to FIG. 5, a block diagram is shown illustrating another example custom function implemented in accordance with another preferred embodiment of the present invention. In another example, a custom function 108c may be configured to implement a voltage regulator function. The voltage regulator function may be configured to use an off-chip pass device. In one example, the voltage regulator using an off-chip pass device may be implemented using three of the regions 102. For example, the custom function 108c may comprise a linear regulator 150 implemented in a first region 102. A second region 102 may be configured to present an external supply voltage (e.g., IO) to an internal I/O supply voltage bus (e.g., VDDIO). A third region 102 may be configured to present an external supply voltage (e.g., CORE) to an internal core voltage supply bus (e.g., VDDCORE). In one example, the supply voltage IO may be 1.5V and the supply voltage CORE may be 1.2V.

An output from the first region 102 may be presented to a gate of an external pass device 152. In one example, the external pass device 152 may be implemented as one or more metal oxide semiconductor field effect transistors (MOSFETs). However, other types and/or polarities of transistors may be implemented accordingly to meet the design criteria of a particular implementation.

A source of the external pass device 152 may be connected to receive the supply voltage IO. A drain of the external pass device 152 may be connected to present the supply voltage CORE. The linear regulator 150 may have an input (e.g., SENSE) that may be coupled to the internal core supply voltage bus and an output that may present a signal (e.g., FORCE). The signal FORCE may be implemented as a control signal. The signal FORCE may be presented to the gate of the external pass device 152. The linear regulator 150 may be configured to sense and control a voltage level of the internal core supply voltage bus VDDCORE using the external pass device 152. In one example, the multi-slot function 108c may be configured to generate a core voltage of 1.2 volts using an IO voltage supply of 1.5 volts. However, other voltage levels may be implemented accordingly to meet the design criteria of a particular implementation.

Figure 6:
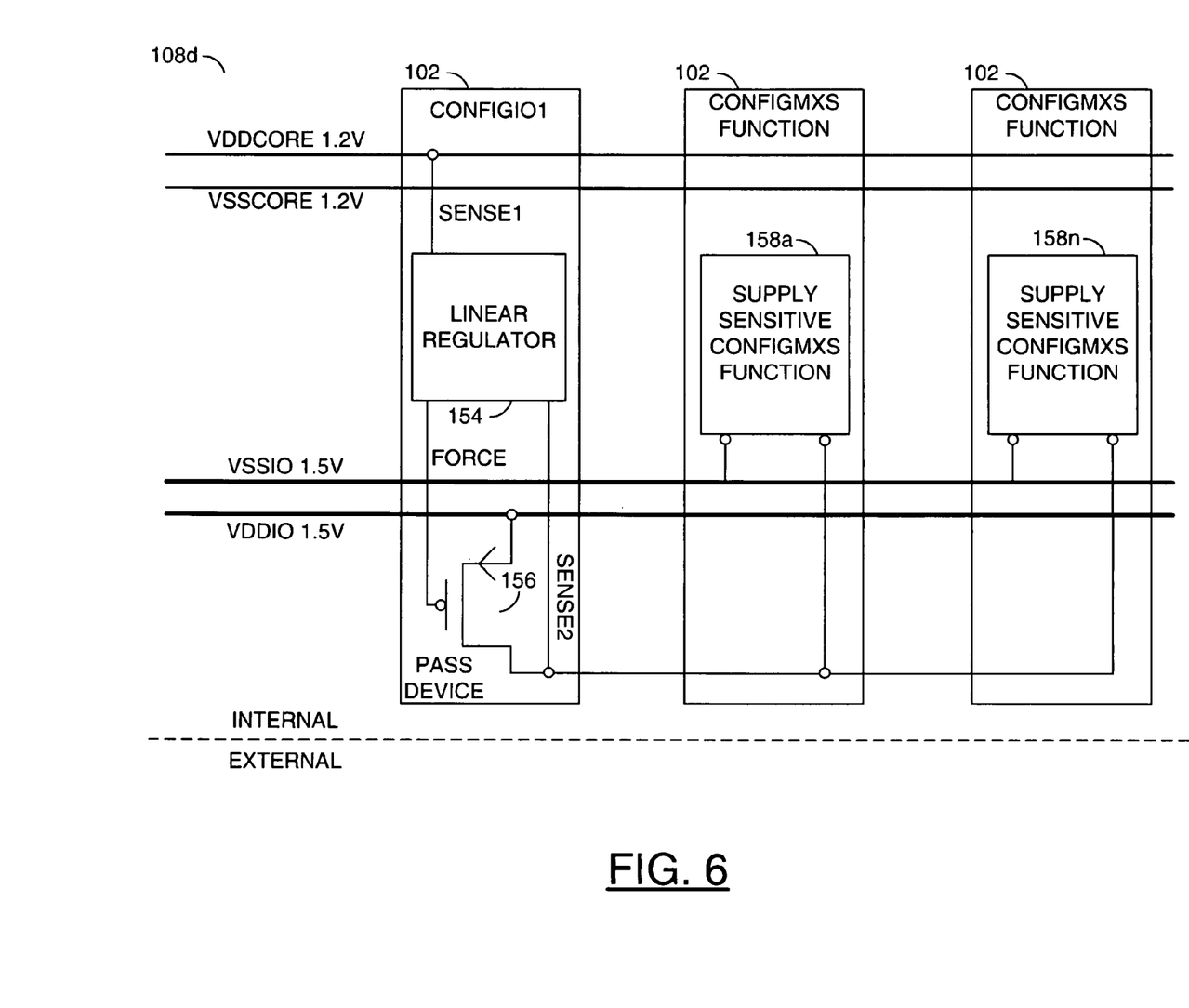
FIG. 6 is a block diagram illustrating another relocatable linear regulator function in accordance with a preferred embodiment of the present invention.

Referring to FIG. 6, a block diagram is shown illustrating another custom linear regulator function in accordance with a preferred embodiment of the present invention. In another example, a custom mixed-signal function 108d may be implemented comprising a linear regulator 154, a pass device 156 and one or more supply sensitive mixed-signal (MXS) functions 158a-n. The custom mixed-signal function 108d may be configured to implement a voltage regulator using an on-chip pass device. The voltage regulator 154 may be implemented similarly to the regulator 150 in FIG. 4 except that the on-chip pass device 156 may be implemented as part of the regulator sub-function. In one example, a supply voltage for the functions 158a-n may be provided by the internal pass device 156 and a supply ground may be provided by an I/O supply ground (e.g., VSSIO).

An output from the regulator 154 may present a signal (e.g., FORCE) to a gate of the internal pass device 156. In one example, the internal pass device 156 may be implemented as one or more metal oxide semiconductor field effect transistors (MOSFET). However, other transistor types and numbers available in the region 102 may be configured accordingly to meet the design criteria of a particular implementation. A source of the internal pass device 156 may be connected to receive an I/O supply voltage (e.g., VDDIO). A drain of the internal pass device 156 may be connected (or routed) to the supply sensitive functions 158a-n. The linear regulator 154 may have a first input (e.g., SENSE1) that may be coupled to an internal core supply voltage bus (e.g., VDDCORE) and a second input (e.g., SENSE2) that may be coupled to the drain of the pass device 156. In another example, the input SENSE2 may be routed to monitor the voltage at the supply sensitive functions 158a-n.

The linear regulator 154 may be configured to sense and control a voltage level presented to the supply sensitive functions 158a-n based on the internal core supply voltage bus using the internal pass device 156. In one example, the regulator 154 may be configured to generate a voltage of 1.2 volts using an IO voltage supply of 1.5 volts. However, other voltage levels may be implemented accordingly to meet the design criteria of a particular implementation.

Figure 7:
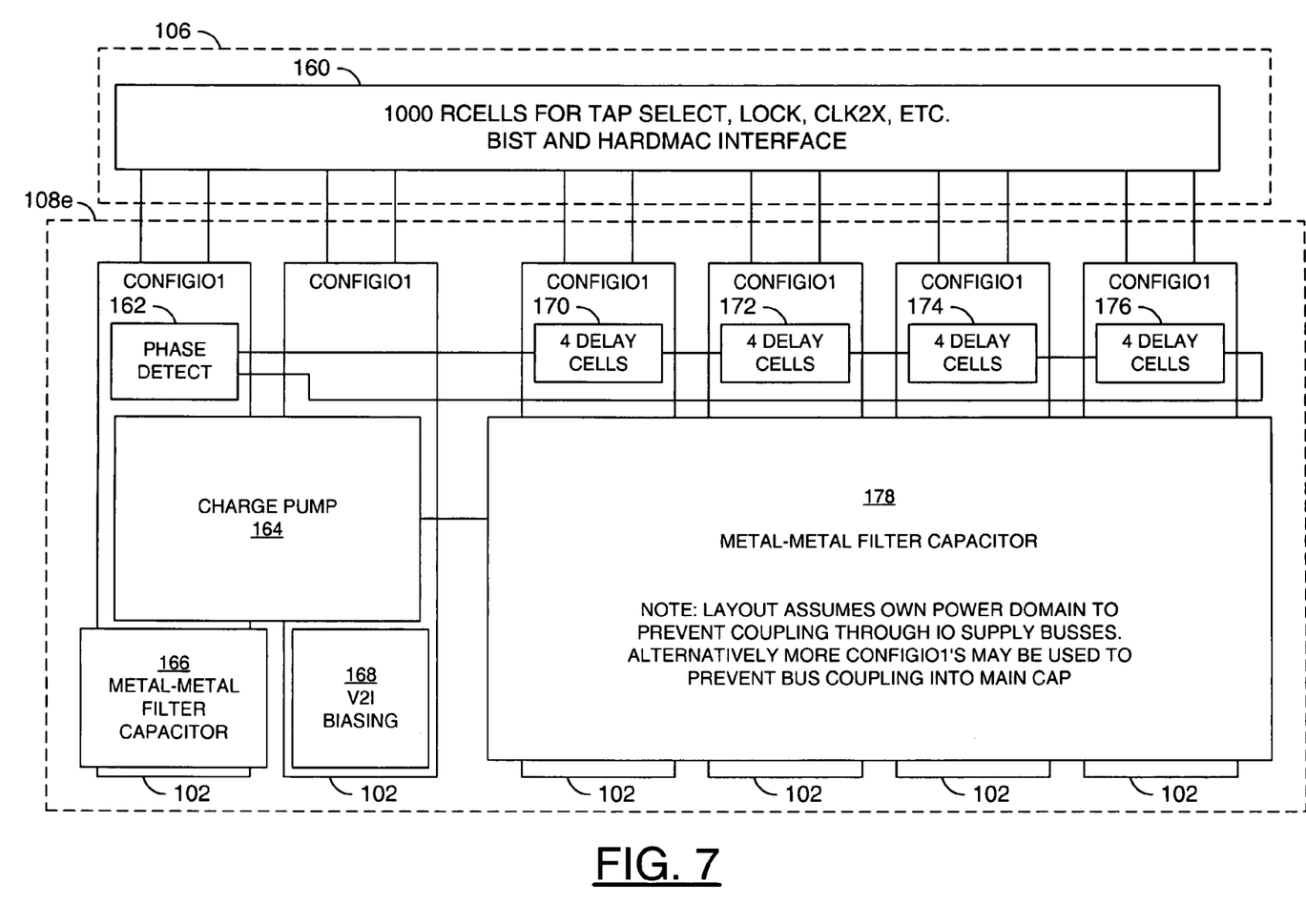
FIG. 7 is a block diagram illustrating a relocatable delay locked loop (DLL) function in accordance with a preferred embodiment of the present invention.

Referring to FIG. 7, a block diagram is shown illustrating a custom delay locked loop (DLL) function in accordance with a preferred embodiment of the present invention. The custom delay locked loop function may comprise (i) a custom mixed-signal function 108e implemented over a number of regions 102 and (ii) a sub-function 160 that may be implemented, in one example, using R-cells in a portion of the region 106. The custom mixed-signal function 108e may comprise a sub-function 162, a sub-function 164, a sub-function 166, a sub-function 168, a sub-function 170, a sub-function 172, a sub-function 174, a sub-function 176 and a sub-function 178. The sub-functions 160-178 may be implemented with one or more metal mask sets configured to customize one or more respective regions 102 and/or a portion of the region 106.

In one example, the sub-function 160 may comprise circuitry for tap selection, lock detection, clock generation, built-in self-test (BIST) and hardmac interfacing. The sub-function 160 may be implemented using a portion of the R-cells (e.g., approximately 1,000 R-cells) in the region 106.

The sub-function 162 may comprise a phase detection circuit (or block). The sub-function 164 may comprise a charge pump. The sub-function 166 may comprise a metal-metal filter capacitor. The sub-function 168 may comprise a voltage-to-current (V2I) biasing circuit (or block). The sub-functions 170-176 each may comprise a number of delay cells. In one example, each of the sub-functions 170-176 may be implemented with four delay cells. The sub-function 178 may comprise a metal-metal filter capacitor. In general, the layout of the custom mixed-signal function 108e may be implemented with a local power domain to prevent coupling through I/O supply busses. Alternatively, additional regions 102 may be configured to prevent bus coupling into the main capacitor. In one example, the sub-function 162-168 may be implemented using two of the regions 102. Each of the sub-functions 170-176 may be implemented in a portion of a respective region 102. The sub-function 178 may be implemented across a number of regions 102.

Figure 8:
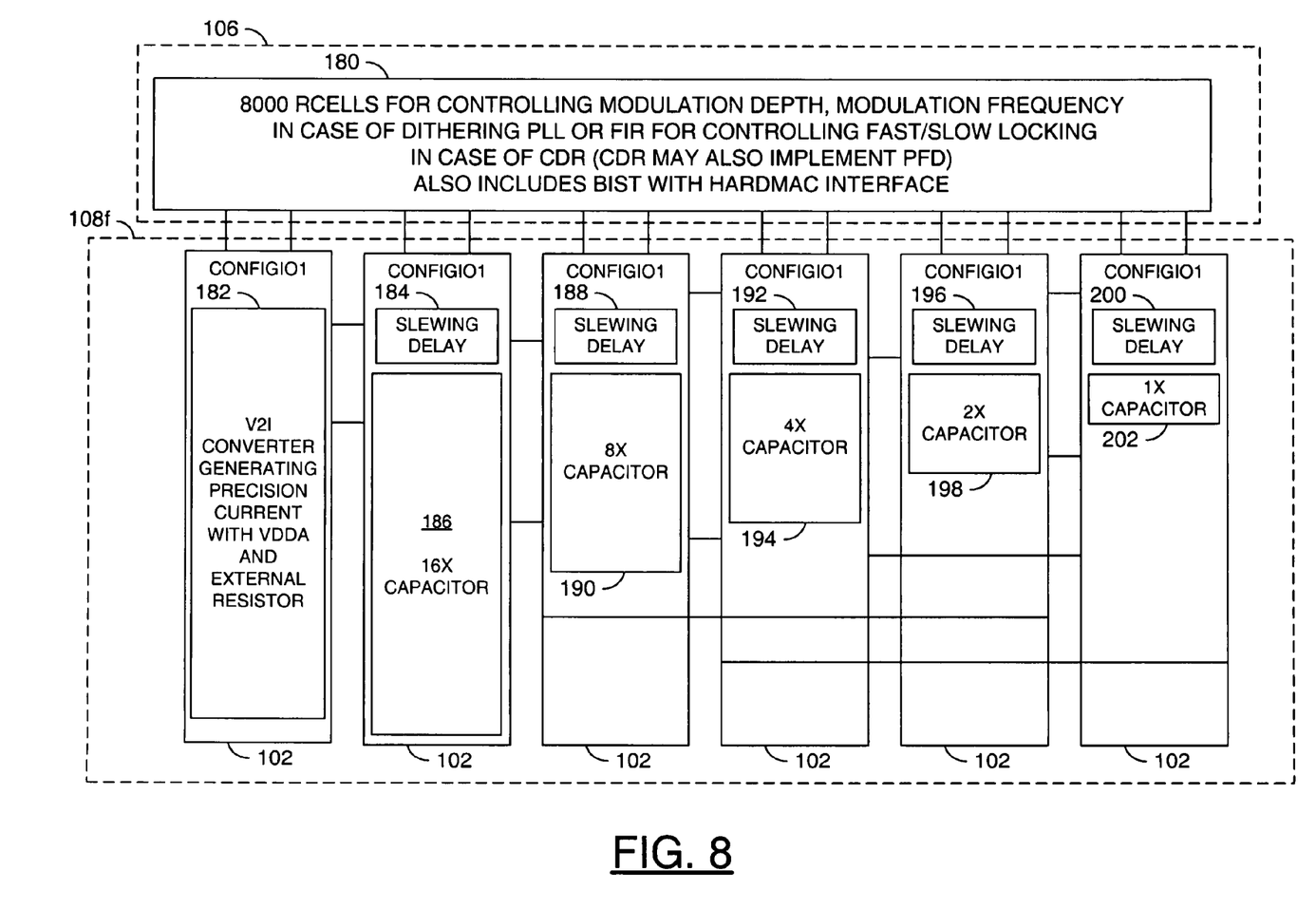
FIG. 8 is a block diagram illustrating a relocatable phase interpolator function in accordance with a preferred embodiment of the present invention.

Referring to FIG. 8, a block diagram is shown illustrating a phase interpolator function in accordance with a preferred embodiment of the present invention. The phase interpolator function may comprise a sub-function 180, a sub-function 182, a sub-function 184, a sub-function 186, a sub-function 188, a sub-function 190, a sub-function 192, a sub-function 194, a sub-function 196, a sub-function 198, a sub-function 200 and a sub-function 202. The sub-function 180 may be implemented in a portion of the region 106. In one example, the sub-function 180 may be configured to control modulation depth, modulation frequency (e.g., in the case of a dithering PLL) or finite impulse response (FIR) circuitry for controlling fast/slow locking in the case of clock data recovery (CDR). For example, CDR may also implement a phase frequency detector (PFD). The region 180 may also implement built-in self-test (BIST) and hardmac interface circuitry. In one example, the sub-function 180 may be implemented using 8,000 R-cells of the region 106.

The sub-functions 182-202 may be implemented as part of a custom mixed-signal function 108f. In one example, the custom mixed-signal function 108f may be implemented using six of the regions 102. For example, the sub-function 182 may be implemented in a single region 102. The sub-function 182 may comprise a voltage-to-current (V2I) converter configured to generate a precision current with an analog supply voltage (e.g., VDDA) and an external resistor. The sub-functions 184 and 186 may be implemented together in a single region 102. The sub-functions 188 and 190 may be implemented together in a single region 102. The sub-functions 192 and 194 may be implemented together in a single region 102. The sub-functions 196 and 198 may be implemented together in a single region 102. The sub-functions 200 and 202 may be implemented together in a single region 102. The sub-functions 184, 188, 192, 196 and 200 may each be implemented as a slewing delay circuit (or block). The sub-functions 186, 190, 194, 198 and 202 may each be implemented as capacitors. In one example, the sub-functions 186, 190, 194, 198 and 202 may have a binary scaled respective size (e.g., 16×, 8×, 4×, 2×, 1× respectively).

In general, the layout of the custom mixed-signal function 108f may be configured to share an isolated supply with the DLL of FIG. 7. Interconnection may be implemented between a number of the regions 102 and/or between the region 106 and the regions 102. For example, routing may be implemented in the region 106.

Figure 9:
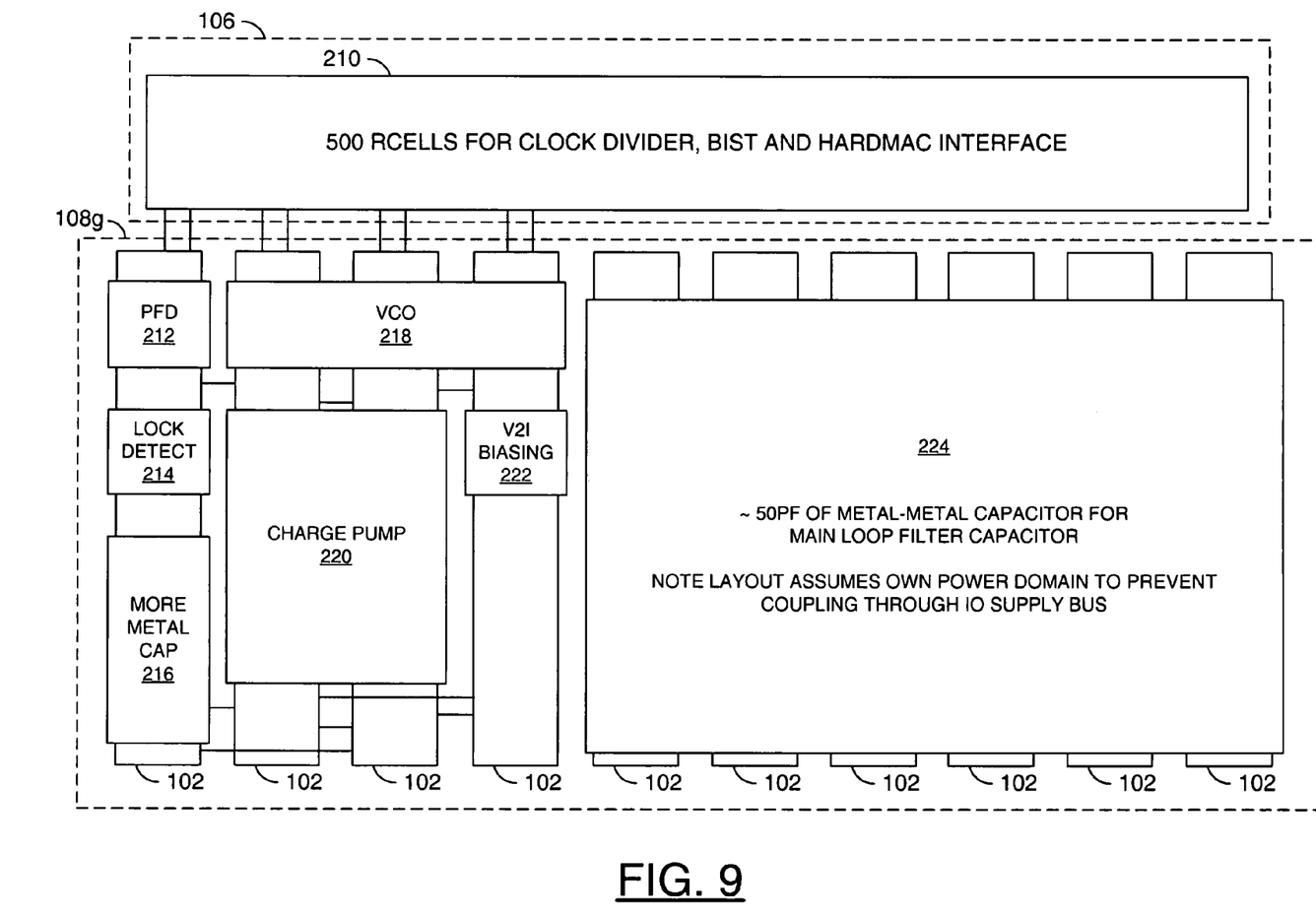
FIG. 9 is a block diagram illustrating a relocatable phase locked loop (PLL) function in accordance with a preferred embodiment of the present invention.

Referring to FIG. 9, a block diagram is shown illustrating a phase locked loop (PLL) function in accordance with a preferred embodiment of the present invention. The phase locked loop function may comprise a sub-function 210 implemented using a portion of the region 106 and a custom mixed-signal function 108g. In one example, the sub-function 210 may be implemented using 500 R-cells of the region 106. The sub-function 210 may be configured to provide a clock divider, built-in self-test (BIST) and hardmac interface circuitry.

The custom mixed-signal function 108g may comprise a number of sub-functions 212-224. The sub-functions 212-224 may be implemented, in one example, using ten of the regions 102. For example, the sub-function 212, 214 and 216 may be implemented in a single region 102. The sub-function 212 may comprise a phase frequency detector (PFD). The sub-function 214 may comprise a lock detect circuit (or block). The sub-function 216 may comprise a metal-metal capacitor. The sub-functions 218, 220 and 222 may be implemented using three of the regions 102. For example, the sub-function 218 may comprise a voltage control oscillator (VCO) implemented across the three regions 102. The sub-function 220 may comprise a charge pump implemented across two of the three regions 102. The sub-function 222 may comprise a voltage-to-current (V2I) biasing circuit (or block). The sub-function 224 may be implemented, in one example, using six of the regions 102. The sub-function 224 may comprise a metal-to-metal capacitor configured as a main loop filter capacitor. In one example, the sub-function 224 may provide approximately 50 picofarads (pF) of capacitance. In general, the layout of the custom mixed-signal function 108g may implement a separate power domain to prevent coupling through I/O supply busses.

Routing may be implemented between the region 106 (e.g., the R-cells) and each of the regions 102 containing the VCO 218 and the PFD 212. In general, each block may have a route to a nearby block such that all of the blocks have a connection directly to or through the other blocks.

Figure 10:
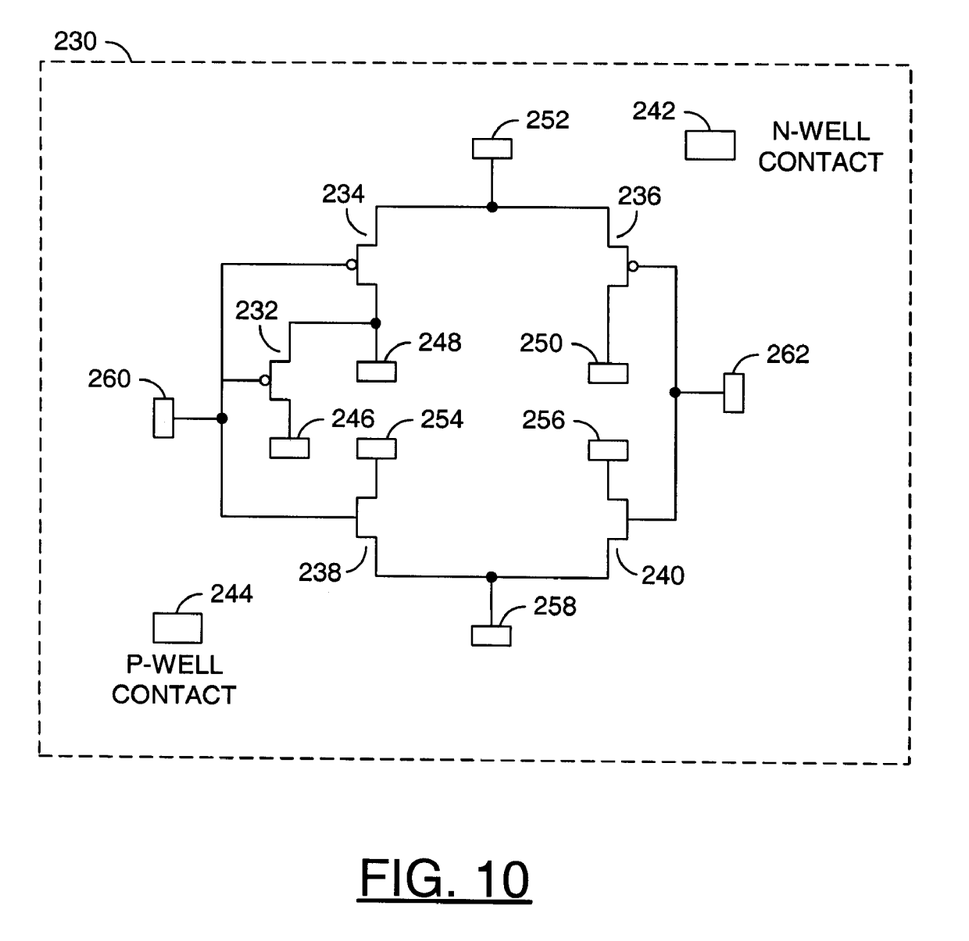
FIG. 10 is a schematic diagram illustrating an example R-cell.

Referring to FIG. 10, a schematic diagram illustrating an example implementation of an R-cell 230 is shown in accordance with a preferred embodiment of the present invention. The R-cell 230 generally comprises a transistor 232, a transistor 234, a transistor 236, a transistor 238, a transistor 240, an n-well contact 242, a p-well contact 244, a transistor contact 246, a transistor contact 248, a transistor contact 250, a transistor contact 252, a transistor contact 254, a transistor contact 256, a transistor contact 258, a gate contact 260 and a gate contact 262.

The transistor 232 may be implemented as a p-channel MOSFET. A gate of the transistor 232 may be connected to the gate contact 260. A first node (e.g., source or drain) of the transistor 232 may be connected to the transistor contact 246. A second node (e.g., drain or source) of the transistor 232 may be connected to the transistor contact 248. In one embodiment, a channel width of the transistor 232 may be approximately 0.3 micrometers (um). A channel length of the transistor 232 may be approximately 0.115 um.

The transistor 234 may be implemented as a p-channel MOSFET. A gate of the transistor 234 may be connected to the gate contact 260. A first node (e.g., source or drain) of the transistor 234 may be connected to the transistor contact 248. A second node (e.g., drain or source) of the transistor 234 may be connected to the transistor contact 252. In one embodiment, a channel width of the transistor 234 may be approximately 1.59 um. A channel length of the transistor 234 may be approximately 0.115 um.

The transistor 236 may be implemented as a p-channel MOSFET. A gate of the transistor 236 may be connected to the gate contact 262. A first node (e.g., source or drain) of the transistor 236 may be connected to the transistor contact 250. A second node (e.g., drain or source) of the transistor 236 may be connected to the transistor contact 252. In one embodiment, a channel width of the transistor 236 may be approximately 1.59 um. A channel length of the transistor 236 may be approximately 0.115 um.

The transistor 238 may be implemented as an n-channel MOSFET. A gate of the transistor 238 may be connected to the gate contact 260. A first node (e.g., source or drain) of the transistor 238 may be connected to the transistor contact 254. A second node (e.g., drain or source) of the transistor 238 may be connected to the transistor contact 258. In one embodiment, a channel width of the transistor 238 may be approximately 0.88 um. A channel length of the transistor 238 may be approximately 0.115 um.

The transistor 240 may be implemented as an n-channel MOSFET. A gate of the transistor 240 may be connected to the gate contact 262. A first node (e.g., source or drain) of the transistor 240 may be connected to the transistor contact 258. A second node (e.g., drain or source) of the transistor 240 may be connected to the transistor contact 256. In one embodiment, a channel width of the transistor 240 may be approximately 1.235 um. A channel length of the transistor 240 may be approximately 0.115 um.

The R-cells 230 generally include all fabrication layers between well diffusions and a first metal layer, inclusive. When initially fabricated, each R-cell is isolated from neighboring R-cells. Therefore, any particular R-cell may be later connected through one or more upper metal layers to other circuitry (e.g., other R-cells 120, I/O slots 102, hard macros 104, firm macros, soft macros, and/or modules 108).

Figure 11:
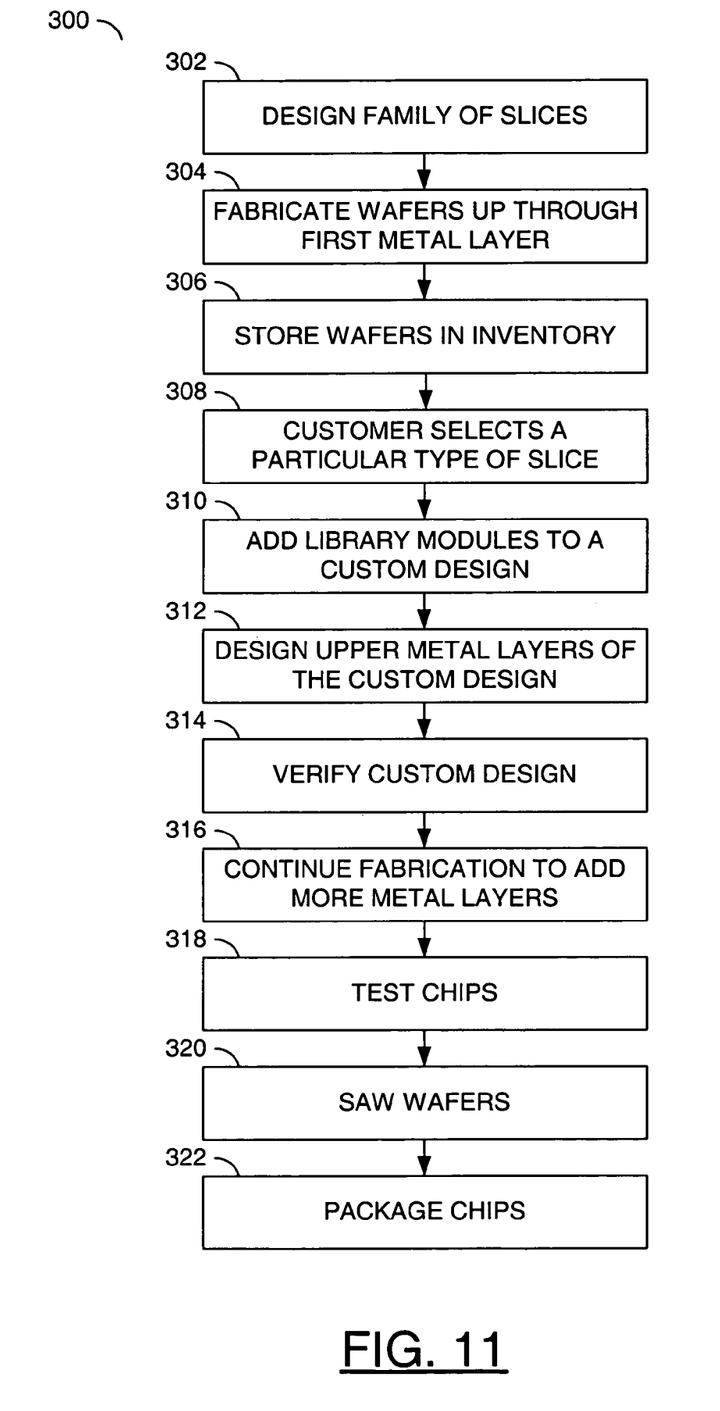
FIG. 11 is a flow diagram illustrating a design process in accordance with the present invention.

Referring to FIG. 11, a flow diagram of an example method 300 for designing and providing a chip is shown. The method 300 generally comprises a step (or block) 302, a step (or block) 304, a step (or block) 306, a step (or block) 308, a step (or block) 310, a step (or block) 312, a step (or block) 314, a step (or block) 316, a step (or block) 318, a step (or block) 320 and a step (or block) 322.

The method (or process) 300 may start with the design of a family of slices (e.g., including slice 100) in step 302. Each different slice design in the family may include a different assortment of fixed memory blocks, memory physical interface blocks, communication blocks, clock generation blocks, customizable input/output blocks, fixed design input/output blocks, and/or processor blocks. An initial fabrication may be performed (e.g., the step 304) to create wafers in each of the families. The wafers may then be placed in storage (e.g., the step 306) until needed to fill a customer order. Storage may last from days to months, or even longer.

After the wafers have been fabricated, or while the wafers are being fabricated, a customer may begin developing a custom design (e.g., involving addition of custom functions to the base wafer) by selecting one of the members from the slice family as a starting point (e.g., the step 308). Using the circuitry and/or diffusions provided by the selected slice member, the customer may add standard library blocks to the selected slice to increase the functionality (e.g., the step 310). The standard library blocks may comprise hard IP, firm IP and/or soft IP that utilize the regions 102, the regions 106 and any other configurable elements in the slice to implement a custom function (e.g., processor, PLL, memory, etc.).

The customer may continue the development by designing interconnecting traces (or wires) for signals and power in one or more metal (or conductive) layers, starting from the second metal layer and up (e.g., the step 312). The design of the upper metal layers may provide connections among the predefined circuitry in the particular slice and the standard library cells added to the slice. The design of the upper metal layers may also be used to create (or form) custom circuitry (e.g., configurable mixed-signal building block functions) using devices (e.g., transistors, resistors, etc.) in the regions 102. For example, a function unavailable in the library of standard blocks may be synthesized using building block functions formed with the devices in the regions 102 and/or the region 106.

In general, those skilled in the field or fields relevant to each of the embodiments of the present invention would be able to implement each of the sub-functions illustrated in the block diagrams of FIGS. 2-9 based on the present disclosure. Therefore, one reasonably skilled in the art would be able to make and use the present invention from the present disclosure coupled with information known in the art without undue experimentation.

While the invention has been particularly shown and described with reference to the preferred embodiments thereof, it will be understood by those skilled in the art that various changes in form and details may be made without departing from the spirit and scope of the invention.

The invention claimed is:

1. A method for producing a chip, comprising the steps of:
   (A) fabricating said chip only up to and including a first metal layer during a first manufacturing phase such that an input/output (I/O) region of said chip has a plurality of slots, wherein each of said slots has a plurality of first transistors and a core region of said chip has an array of cells comprising a plurality of second transistors, each of said cells comprising (i) five of said second transistors, (ii) two well contacts and (iii) eleven pads in said first metal layer connected to each node of said second transistors and each of said well contacts, respectively;
   (B) designing a plurality of upper metal layers above said first metal layer in response to a custom design created after said first fabricating has started, said upper metal layers interconnecting a plurality of said first transistors to form a plurality of mixed-signal building block functions; and
   (C) fabricating said chip to add said upper metal layers during a second manufacturing phase.

2. The method according to claim 1, wherein step (B) further comprises the sub-step of:
   designing said upper metal layers to interconnect at least two of said building block functions within said I/O region.

3. The method according to claim 1, further comprising the step of:
   designing said upper metal layers to configure said first transistors as a mixed-signal building block function selected from the group consisting of (i) an operational amplifier, (ii) a comparator, (iii) an analog multiplexer, (iv) an analog switch, (v) a voltage/current reference, (vi) a voltage generator, (vii) an analog peak detector, (viii) an analog delay element, (ix) a resistor array and (x) a capacitor array.

4. The method according to claim 1, further comprising the step of designing said plurality of upper metal layers to interconnect two or more of said plurality of mixed-signal building block functions to form a custom mixed-signal function.

5. The method according to claim 4, wherein said custom mixed-signal function comprises a function selected from the group consisting of (i) a phase locked loop (PLL), (ii) a delay lock loop (DLL), (iii) a temperature sensor, (iv) a regulator, (v) an analog-to-digital converter (ADCs), (vi) a digital-to-analog converter (DAC), (vii) an oscillator and (viii) a filter.

6. The method according to claim 4, wherein said custom mixed-signal function can be placed on any input/output (I/O) slot boundary of said chip.

7. The method according to claim 4, wherein said custom mixed-signal function is configured to operate with analog signals, digital signals or both analog and digital signals.

8. The method according to claim 1, wherein:
   said first manufacturing phase configures said chip as a configurable platform capable of being customized for any of a plurality of applications; and
   said second manufacturing phase customizes said chip for a specific application according to specifications defined by an end-user.

9. The method according to claim 1, further comprising the step of designing said plurality of upper metal layers to interconnect a plurality of said second transistors to form a second plurality of mixed-signal building block functions.

10. The method according to claim 9, wherein said second plurality of mixed-signal building block functions comprise circuitry for one or more of (i) clock generation, (ii) built-in self test (BIST), (iii) digital filters, (iv) hardmac interfacing, (v) tap selection, (vi) lock detection, (vii) modulation depth control, (viii) modulation frequency control, (ix) finite impulse response (FIR), (x) state machines, (xii) compare functions and (xiii) control functions.

11. A method for designing a chip, comprising the steps of:
(A) selecting a particular chip design from a plurality of chip designs having (a) an input/output (I/O) region comprising a plurality of slots, each slot having a plurality of first transistors and (b) a core region comprising an array of cells, each of said cells defining a plurality of second transistors, said particular chip having an existing design up to and including a first metal layer and configured to be fabricated during a first manufacturing phase, wherein each of said cells has (i) five of said second transistors, (ii) two well contacts and (iii) eleven pads in said first metal layer connected to each node of said second transistors and each of said well contacts, respectively;
(B) adding a plurality of modules from a library to said particular chip design, each of said modules defining a plurality of upper metal layers above said first metal layer that interconnect some of said first transistors to implement respective mixed-signal building block functions; and
(C) designing a plurality of traces in said upper metal layers interconnecting a plurality of said mixed-signal building block functions to form a custom mixed-signal function within said chip, wherein said upper metal layers can be added to said particular chip during a second manufacturing phase.

12. The method according to claim 11, wherein step (C) further comprises the sub-step of:
designing said upper metal layers to interconnect at least two mixed-signal building block functions.

13. The method according to claim 11, further comprising the step of:
designing said upper metal layers to configure said first transistors as a function selected from the group consisting of (i) an operational amplifier, (ii) a comparator, (iii) an analog multiplexer, (iv) an analog switch, (v) a voltage/current reference, (vi) a voltage generator, (vii) an analog peak detector, (viii) an analog delay element, (ix) a resistor array and (x) a capacitor array.

14. The method according to claim 11, wherein:
said first manufacturing phase configures said chip as a configurable platform capable of being customized for any of a plurality of applications; and
said second manufacturing phase customizes said chip for a specific application according to specifications defined by an end-user.

15. The method according to claim 11, further comprising the step of designing said plurality of upper metal layers to interconnect a plurality of said second transistors to form a second plurality of mixed-signal building block functions.

16. The method according to claim 15, wherein said second plurality of mixed-signal building block functions comprise circuitry for one or more of (i) clock generation, (ii) built-in self test (BIST), (iii) digital filters, (iv) hardmac interfacing, (v) tap selection, (vi) lock detection, (vii) modulation depth control, (viii) modulation frequency control, (ix) finite impulse response (FIR), (x) state machines, (xii) compare functions and (xiii) control functions.

17. A chip comprising:
an input/output region having a plurality of generic pre-diffused regions; and
a core region including an array of cells each having (a) a plurality of transistors and (b) an identical design in a plurality of layers up to and including a first metal layer, wherein at least one upper metal layer above said first metal layer is configured to (i) customize one or more of said generic pre-diffused regions in said input/output region to form a plurality of mixed-signal building block functions and (ii) interconnect two or more of said mixed-signal building block functions to form a custom mixed-signal function, and wherein each of said cells has five of said transistors, two well contacts, and eleven pads in said first metal layer connected to each node of said transistors and each of said well contacts, respectively.

18. The chip according to claim 17, wherein said five transistors, two well contacts and nine pads form an R-cell.

19. The method according to claim 17, wherein said at least one upper metal layer is further configured to interconnect a plurality of said second transistors to form a second plurality of mixed-signal building block functions.

20. The method according to claim 19, wherein said second plurality of mixed-signal building block functions comprise circuitry for one or more of (i) clock generation, (ii) built-in self test (BIST), (iii) digital filters, (iv) hardmac interfacing, (v) tap selection, (vi) lock detection, (vii) modulation depth control, (viii) modulation frequency control, (ix) finite impulse response (FIR), (x) state machines, (xii) compare functions and (xiii) control functions.

* * * * *